(12) United States Patent
Hasegawa et al.

(10) Patent No.: US 8,729,794 B2
(45) Date of Patent: May 20, 2014

(54) DISPLAY DEVICE HAVING THREE LAYER ELECTROCONDUCTIVE FILM

(75) Inventors: Atsushi Hasegawa, Tougane (JP); Naoki Tokuda, Mobara (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 1017 days.

(21) Appl. No.: 12/155,206

(22) Filed: May 30, 2008

(65) Prior Publication Data

US 2008/0309233 A1     Dec. 18, 2008

(30) Foreign Application Priority Data

Jun. 1, 2007 (JP) ................. 2007-146465

(51) Int. Cl.
*H01L 27/15* (2006.01)
*H01L 27/32* (2006.01)

(52) U.S. Cl.
CPC ........ *H01L 27/3244* (2013.01); *H01L 27/3248* (2013.01)
USPC .......................... 313/505; 313/504; 315/169.3

(58) Field of Classification Search
CPC ..................... H01L 27/3244; H01L 27/3248
USPC .................. 313/506, 505; 315/169.3
See application file for complete search history.

(56) References Cited

U.S. PATENT DOCUMENTS

| 7,298,083 | B2 | 11/2007 | Park et al. | |
| 2005/0189874 | A1* | 9/2005 | Park et al. | 313/504 |
| 2006/0197086 | A1* | 9/2006 | Rhee et al. | 257/59 |
| 2007/0058099 | A1 | 3/2007 | Eguchi | |
| 2007/0096614 | A1* | 5/2007 | Shin | 313/112 |

FOREIGN PATENT DOCUMENTS

| CN | 1575078 A | 2/2005 |
| JP | 2003-323131 | * 11/2003 |
| JP | 2004-144826 A | 5/2004 |
| JP | 2007-103098 | 9/2005 |
| JP | 2005-322564 | 11/2005 |
| JP | 2007-102181 | 7/2006 |
| JP | 2006-260950 | 9/2006 |
| JP | 2007-095428 | 4/2007 |
| JP | 2007-102181 | 4/2007 |
| JP | 2007-317606 | * 12/2007 |

* cited by examiner

*Primary Examiner* — Nimesh D. Patel
*Assistant Examiner* — Jacob R Stern

(57) ABSTRACT

There is provided a display device comprising a plurality of active elements on a substrate, a first insulating film for covering the active elements, electroconductive films were separated for each pixel on the first insulating film, a light-emitting layer disposed in an upper layer of the electroconductive films, and a common electrode disposed in an upper layer of the light-emitting layer, wherein a structure is used in which the electroconductive films have a layered film of a first electroconductive film, second electroconductive film, and third electroconductive film; the first electroconductive film is composed of ITO or chromium; the second electroconductive film is composed of aluminum with alumina on a surface; the second electroconductive film covers outside edges of the first electroconductive film; the third electroconductive film is composed of ITO; and the first electroconductive film and third electroconductive film are caused to contact each other.

5 Claims, 9 Drawing Sheets

DISPLAY DEVICE HAVING THREE LAYER ELECTROCONDUCTIVE FILM

CROSS-REFERENCE TO RELATED APPLICATION

The present application claims priority from Japanese application JP2007-146465 filed on Jun. 1, 2007, the content of which is hereby incorporated by reference into this application

BACKGROUND OF THE INVENTION

1. Field of the Invention

The present invention relates to the pixel structure of a display device.

2. Description of the Related Art

Organic EL display devices (organic electroluminescent display devices) constitute one-type of an active matrix display device.

If such organic EL display devices are classified according to the relationship between the orientation of the display surface and the surface on which organic EL elements are formed, these display devices can be roughly divided into (1) bottom emission-type display devices in which the back surface side of the surface on which the organic EL elements are formed is used as the front surface, and (2) top emission-type display devices in which the surface on which the organic EL elements are formed is used as the front surface, conversely from the top emission-type display devices.

Top emission-type (TE-type) active matrix (AM) organic EL display devices (OLED) include the display devices disclosed in Japanese Laid-Open Patent Publication Nos. 2007-103098 and 2007-102181 as conventional techniques.

In active matrix organic EL display devices (AM-OLED), active elements are provided on a glass substrate. Pixel electrodes connected to the active elements are provided in a layer above the active elements. A first inter-layer insulating film is disposed between these active elements and the pixel electrodes.

A TE-type AM-OLED using ITO (indium-tin oxide) or metal pixel electrodes on top of a first inter-layer insulating film is disclosed in Japanese Laid-Open Patent Publication No. 2007-103098.

A structure in which an Al reflective films separated for each pixel electrode is provided on top of the first inter-layer insulating film is disclosed in Japanese Laid-Open Patent Publication No. 2007-102181. Moreover, a TE-type AM-OLED in which a silicon-type second inter-layer insulating film composed of silicon dioxide ($SiO_2$) or silicon nitride (SiN) is further provided on top of these reflective films, and pixel electrodes made of ITO are provided on top of the second inter-layer insulating film, is disclosed in this reference.

SUMMARY OF THE INVENTION

In cases where the aluminum (hereafter indicated as "Al") of the pixel electrodes of a TE-type AM-OLED is stripped away as in Japanese Laid-Open Patent Publication No. 2007-103098, the surface tends to become rough as a result of hillocks and the like that are generated when banks on top of the pixel electrodes are etched, and stable hole injection becomes difficult.

Ordinarily, in a structure in which a silicon-type inter-layer insulating film is interposed between a reflective film and pixel electrodes of a transparent electroconductive film as described in Japanese Laid-Open Patent Publication No. 2007-103098, a reflective film formed by sputtering, an inter-layer insulating film formed by CVD, and a transparent electroconductive film formed by sputtering, are generally formed in that order, and additional processes that involve providing a silicon-type inter-layer insulating film are widely used.

The present inventors investigated a structure in which no silicon-type inter-layer insulating film of the type described in Japanese Laid-Open Patent Publication No. 2007-102181 was formed.

An Al/molybdenum-tungsten alloy (MoW) formed by sputtering is formed into a reflective film by wet bulk etching, and ITO is then directly formed as pixel electrodes on top of this film. In concrete terms, ITO is formed into a film by sputtering, and is then wet-etched into a pattern covering the outside edges of the reflective film. Thus, since the outside edges of the reflective film of Al are covered by ITO, the ITO and Al are not exposed simultaneously. Accordingly, there is almost no battery reaction in the resist stripping liquid, and there is no need to form a silicon-type insulating film on the surface of the Al. Consequently, the process can be shortened. Furthermore, the electrical connection with the active elements is accomplished not by the Al/MoW layer; instead, the ITO films are directly connected with each other. Accordingly, rather than the reflective layer doubling as electrodes, the efficiency of current injection into the light-emitting layer is improved.

Furthermore, in Japanese Laid-Open Patent Publication No. 2007-102181, it is disclosed that auxiliary wiring is used in order to provide uniform resistance within the plane of the common electrode shared by all the pixels. Furthermore, as one example, it is disclosed that auxiliary wiring is formed in the same layer as the pixel electrodes, openings are formed in the banks, and connections are made with the common electrode via these contact holes.

Similar to Japanese Laid-Open Patent Publication No. 2007-102181, the auxiliary-wiring and pixel electrodes are formed with the same structure and by the same process, thus leading to a reduction in manufacturing costs.

However, if the auxiliary wiring is formed from ITO, since the resistance of ITO is higher than that of metal or alloy wiring, the effect in lowering the resistance of the common electrode is small.

Accordingly, the present inventors have proposed using a layered structure for the ITO of the pixel electrodes and the Al of the reflective film as auxiliary wiring without further modifications. Considering the function of auxiliary wiring, the effect is small unless current flows through the layered structure of Al. In order to cause a current to flow through the Al, it is important to lower the resistance of the interface between the ITO and Al. This resistance is increased not only by the auto-oxidation of the Al, but also by the diffusion of the Al and thick formation of alumina.

A similar problem also occurs in the layered structure of the wiring; since oxides of high-melting metals have a smaller resistance than alumina, this is usually counteracted by disposing an electroconductive film of a high-melting metal such as MoW or the like in the upper surface ITO interface of the Al.

However, most high-melting metals have low reflectivity; accordingly, if the reflective film of the display device is formed from the same metal film as the auxiliary wiring, the reflectivity of the pixels is lowered. If the reflectivity drops, the useful life is shortened as a result. Accordingly, conventional methods of layered wiring structures cannot be simply applied.

Consequently, the present inventors devised a structure which is designed so that a high auxiliary wiring effect can be obtained without lowering the reflectivity.

First, the present inventors used the layered structure "ITO2 (uppermost layer)/Al/MoW ('Al/Mow' as intermediate layer of)/ITO1 (lowermost layer)," and devised the system so that ITO1 and ITO2 are directly connected. Alumina is produced at the interface between the ITO2 and Al; however, at the undersurface of the intermediate layer, since Al can maintain electrical continuity with the ITO1 via the MoW, the Al/MoW itself can also be utilized as the auxiliary wiring.

Furthermore, as preferable structural example 1, a structure was devised in which the outside edges (widths) of the respective layers of the layered structure satisfied the relationship of Eq. 1 below, the uppermost layer covered the exposed surface of the intermediate layer, and the intermediate layer covered the exposed surface of the lowermost layer.

$$ITO1 < Al \approx MoW(\text{bulk etching}) < ITO2 \qquad \text{Eq. 1}$$

However, contact holes or notches are formed in portions of the intermediate layer (exception to Eq. 1), and ITO1 and ITO2 are directly connected.

In this layered structure, the uppermost layer covers the entire intermediate layer, and the intermediate layer covers the entire lowermost layer; accordingly, the possibility that the ITO1 or ITO2 and Al in the intermediate layer will simultaneously make direct contact with the resist stripping liquid is reduced.

Furthermore, as a preferable structural example 2, a structure was devised in which the widths of the respective layers of the layered structure satisfied the relationship of Eq. 2 below, the outside edges of the intermediate layer (Al/MoW) were set at the same positions or to the inside of the outside edges of the lowermost layer, the exposed surface of ITO1 were covered by ITO2, and the connection between the ITO2 (uppermost layer) carried on top of the intermediate layer and the ITO1 (lowermost layer) exposed from the ends of the intermediate layer was ensured.

$$Al \approx MoW(\text{bulk etching}) \leq ITO1 < ITO2 \qquad \text{Eq. 2}$$

Thus, since the ITO1 of the lowermost layer is exposed from the intermediate layer, the ITO1 of the lowermost layer and the Al of the intermediate layer make contact in the resist stripping liquid. However, the ITO2 of the uppermost layer and the intermediate layer do not make contact in the resist stripping liquid; accordingly, the battery reaction arising from the ITO2 of the uppermost layer can be suppressed.

Cr may be used instead of the ITO1 of these lower layers.

Furthermore, structural examples 1 and 2 may be applied to either the pixel electrodes or auxiliary wiring alone; alternatively, the same structural example may be applied to both, or structural example 1 may be applied to one, and structural example 2 to the other.

In the present invention, a display device which realizes high reflectivity and a lowered wiring resistance can be provided.

BRIEF DESCRIPTION OF THE DRAWINGS

FIG. 4 is a view showing the layer structure of the optical film OF;

DETAILED DESCRIPTION OF THE INVENTION

Examples of organic EL display devices to which the present invention has been applied will be described below.

Example 1

Figure 1:
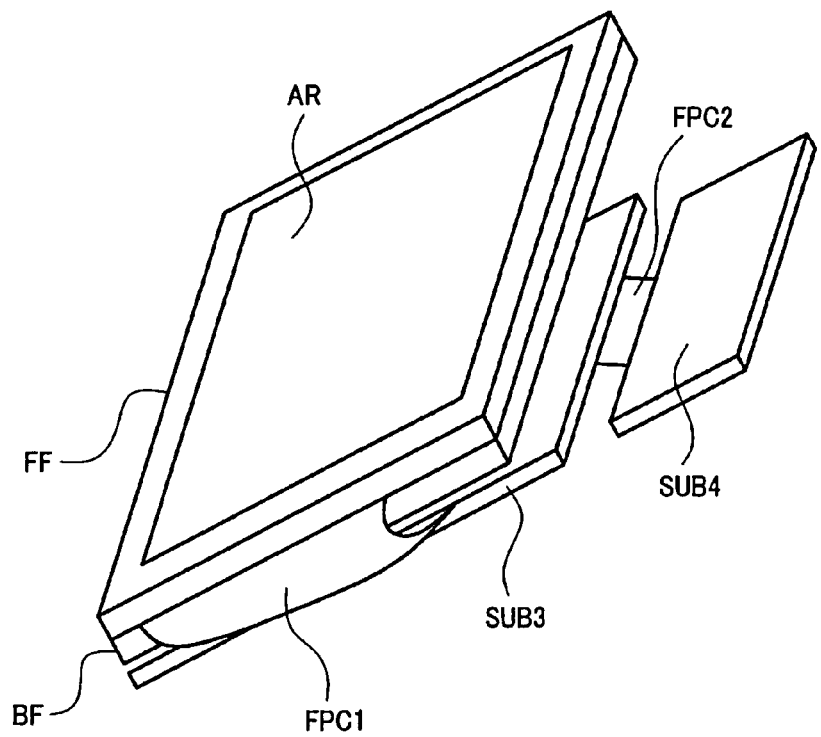
FIG. 1 is a view showing the external appearance of an organic EL display device.

FIG. 1 is a view showing the external appearance of an organic EL display device. This organic EL display device has a structure comprising a front-surface frame FF having an opening that exposes the display area AR of an organic EL display panel (hereafter also referred to simply as a "panel"), a back-surface frame BF which covers the entire back surface of the organic EL display panel and which is fastened to the front-surface frame FF, a third substrate SUB3 which is further disposed on the back surface of the back-surface frame BF, a first flexible circuit board FPC1 which is attached between the terminals PAD of the third substrate SUB3 and the organic EL display panel, a fourth substrate SUB4, and a second flexible circuit board FPC2 which connects the third substrate SUB3 and fourth substrate SUB4.

The cross-sectional structure of the organic EL display panel sandwiched between the front-surface frame FF and back-surface frame BF will be described with reference to FIGS. 2 and 3.

Figure 2:
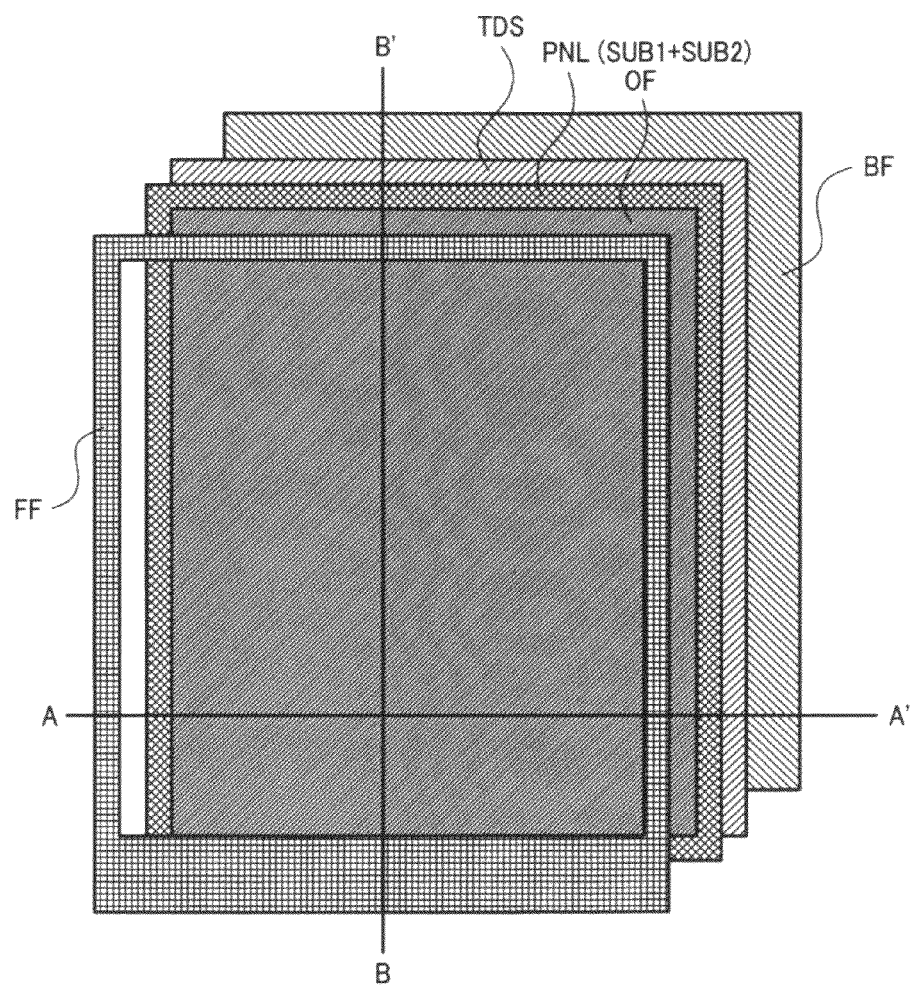
FIG. 2 is an exploded view of an organic EL display panel as seen at an inclination from above the display surface.

FIG. 2 is an exploded view of the organic EL display panel as seen at an inclination from above the display surface. An optical film OF, organic EL display panel PNL, heat-dissipating adhesive sheet TDS, and back-surface frame BF are disposed in that order from the side of the front-surface frame FF.

Figure 3A:
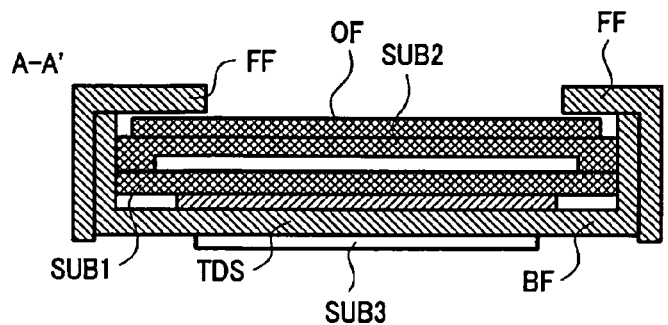
FIG. 3A is a sectional view along line A-A', which is the x direction shown in FIG. 2.
Figure 3B:
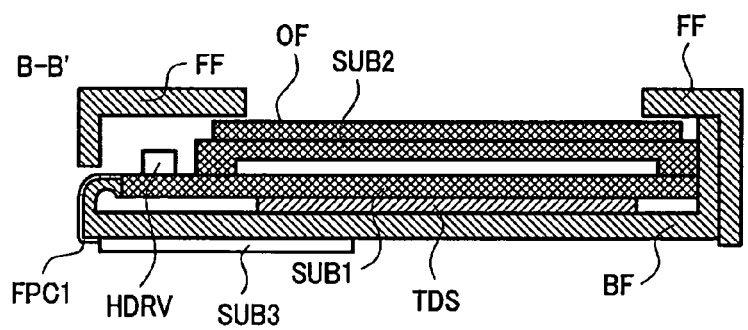
FIG. 3B is a sectional view along line B-B', which is the y direction shown in FIG. 2.

FIG. 3(A) is a sectional view along line A-A', which is the x direction sectional view in the xy-plane shown in FIG. 2. FIG. 3(B) is a sectional view along line B-B', which is the y direction sectional view in the xy-plane shown in FIG. 2.

The front-surface frame FF and back-surface frame BF are composed of an alloy whose chief components are iron and nickel. These are metal frames composed of alloys that include materials known as Anvar and Invar containing approximately 36% iron. It is also possible to use alloy metal frames composed of Super-Invar, which is formed by including nickel in Invar. Furthermore, in cases where stainless steel or iron is used, the parts can be manufactured easily and inexpensively.

The front-surface frame FF has a shape that is bent toward the back-surface frame BF, and has an opening that is considerably larger than the display area of the first substrate SUB1.

The back-surface frame BF is bent toward the front-surface frame FF so as to be able to envelop the optical film OF, first substrate SUB1, second substrate SUB2, and heat-dissipating adhesive sheet TDS.

Furthermore, the upper surface has a bottom surface area that is larger than the areas of any of the optical film OF, first substrate SUB1, second substrate SUB2 or adhesive sheet ADF, so that these films can be accommodated.

Figure 4:
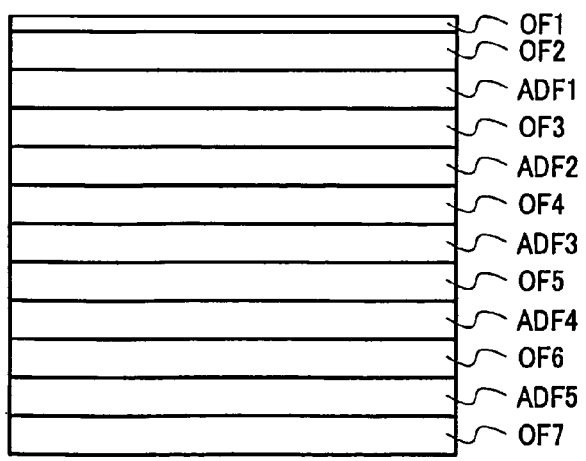

FIG. 4 is a view showing the layer structure of the optical film OF. From the outside, the optical film OF has a layered structure comprising an anti-electrostatic/anti-reflective layer OF1, a linear polarization layer OF2, an adhesive layer ADF1, a ½-wavelength phase plate OF3, an adhesive layer ADF2, a ¼-wavelength phase plate OF4, an adhesive layer ADF3, a visual angle compensating layer OF5, an adhesive layer ADF4, a cholesteric liquid crystal layer OF6, an adhesive layer AFD5, and a protective layer OF7. Furthermore, the visual angle compensating layer OF5 is a layer that compensates for the visual angle dependency of transmitted light due to the cholesteric liquid crystal layer.

In the optical film OF, a circular polarization plate is formed by the linear polarization plate OF2 and two phase plates OF3 and OF4, and a polarized light separation film is formed by the cholesteric liquid crystal layer OF6. The visual angle dependency is compensated for by the visual angle compensating layer OF5 due to the polarized light separation film. This optical film OF is constructed so as to be larger than the opening in the front-surface frame BF. Furthermore, the optical films OF1 through OF6 have substantially the same size, and the adhesive layers ADF1 through ADF5 also have substantially the same size.

Organic EL elements are formed on the first substrate SUB1. The substrate is a glass substrate, and the external shape of the substrate is larger than that of the optical film OF. Furthermore, one side of the peripheral area of the first substrate SUB1 is exposed, and data driver ICs are mounted via an anisotropic electroconductive film ACF as driving circuits HDRV on the exposed area using a COG (chip-on-glass) mounting system.

The second substrate SUB2 is a sealing substrate used to accommodate the organic EL elements and internal LTPS circuits inside a sealed space; the external shape of this substrate is smaller than that of the first substrate SUB1 and larger than that of the optical film OF. An arrangement is adopted in which one side of the peripheral area of the first substrate SUB1 is exposed.

Furthermore, the second substrate SUB2 has a recess. To form a dry air-tight seal, the recess is provided with a desiccant formed by coating the edges with a zeolite dissolved in a binder, and dried.

The opposite surfaces of the protruding parts of the second substrate SUB2 formed by the side walls of the recess in the second substrate SUB2 (upper surfaces of the protruding parts) and the first substrate SUB1 are fixed by a cationic polymerization-type ultraviolet-curable adhesive agent with which a spacer is mixed.

Figure 5:
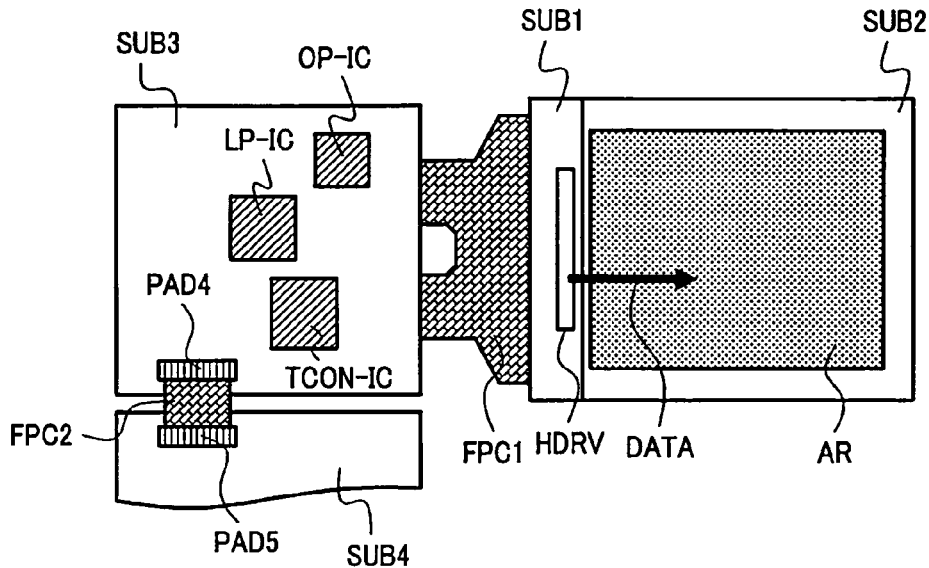
FIG. 5 is a view showing the modular structure of an organic EL display panel, with the frames FF and BF and the optical film OF removed.

FIG. 5 is a view showing the structure of the organic EL display panel, with the front-surface frame FF, back-surface frame BF, and optical film OF removed. The organic EL display panel with the front-surface frame FF, back-surface frame BF, and optical film OF removed comprises the first substrate SUB1 and second substrate SUB2, a third substrate SUB3 in which the outside connection terminals PAD2 and PAD3 (not shown in the figures) and the outside connection terminals PAD1 of the first substrate SUB1 are connected by a flexible circuit board FPC1, and a fourth substrate SUB4 in which the outside connection terminals PAD5 and outside connection terminals PAD4 of the third substrate SUB3 are connected by a flexible circuit board FPC2.

The third substrate SUB3 comprises a power supply IC (OP-IC) used to drive the light-emitting elements of the first substrate SUB1, a power supply IC for the LTPS circuits of the first substrate (LP-IC), and a timing control IC (TCON-IC).

The fourth substrate SUB4 is an outside interface substrate, and is a substrate that supplies a gradation signal for each RGB from the power supply and from the outside to the third substrate according to a communication protocol such as LVDS or the like for each pixel.

Figure 6:
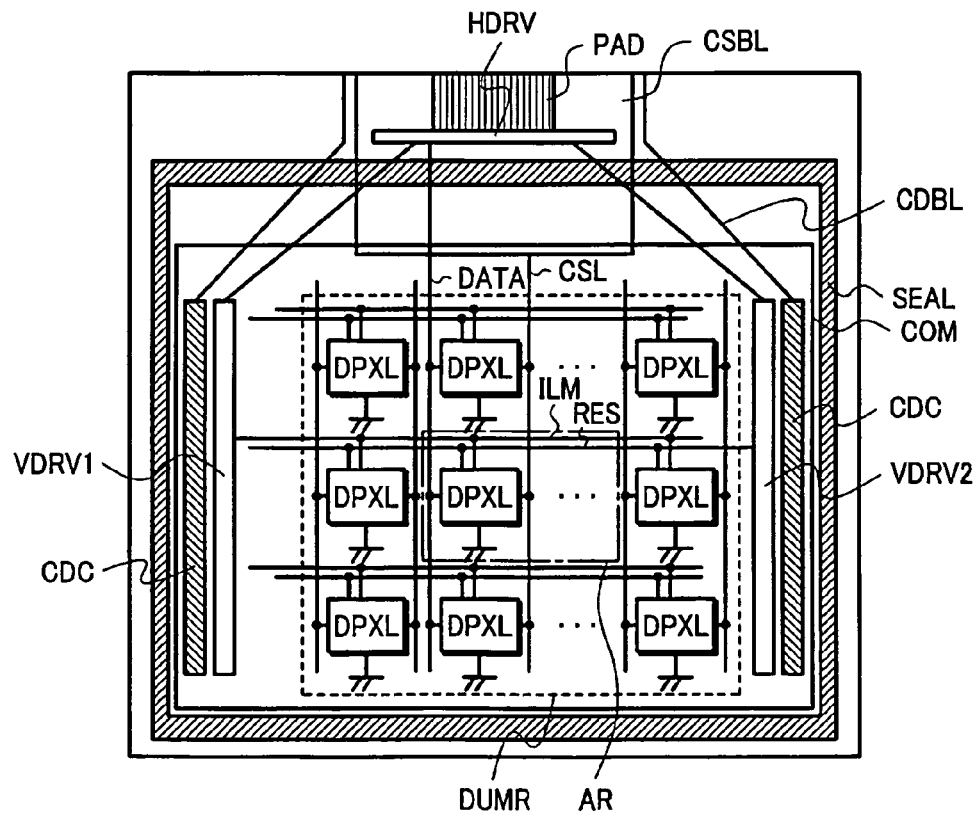
FIG. 6 is a diagram of the main construction on the first substrate.

FIG. 6 is a view showing the main construction on the first substrate SUB1. This will be described below with reference to FIG. 6.

The first substrate SUB1 comprises a display pixel area AR, a dummy pixel region DUMR, data lines DATA, a current supply line CSL, a current supply bus line CSBL, a luminescence control line ILM, a reset line RES, data line driving circuits HDRV, a first scanning line driving circuit VDRV1, a second scanning line driving circuit VDRV2, a common electrode COM, dummy pixels DPXL, pixels PXL, a common electrode bus line CDBL, common electrode contacts CDC, a sealing area SEAL, and outside terminals PAD.

The display pixel area AR is disposed in the center of the first substrate SUB1, and the display pixels PXL are disposed in the form of a matrix.

The dummy pixel region DUMR is disposed on the four sides surrounding the display pixel area AR, and has the same pixel layout as the display pixels PXL.

The data line driving circuits HDRV is disposed to the outside of the sealing region SEAL along the upper side of the first substrate. The data line driving circuits HDRV divides one frame period into two periods, supplies a data signal of one frame in the first half-period as a gradation signal voltage to the data lines DATA, and outputs a triangular wave in the second half-period.

The first scanning line driving circuit VDRV1 is disposed between the sealing region SEAL and the dummy pixel region along the left side of the first substrate.

The second scanning line driving circuit VDRV2 is disposed between the sealing region SEAL and the dummy pixel region DUMR along the right side of the first substrate.

The common electrode contacts CDC are disposed between the sealing region SEAL and each of the left and right scanning line driving circuits VDRV1 and VDRV2. The common electrode contacts CDC are connection pads disposed beneath an opening part formed in the bank and the bank underlayer-insulating film.

The common electrode COM covers the display pixel area AR, dummy pixel (region) DUMR, first scanning line driving circuit VDRV1, second scanning line driving circuit VDRV2, and common electrode contacts CDC. Furthermore, the common electrode COM is connected to the common electrode contacts CDC via an opening part formed in the bank and the bank underlayer insulating film.

The data lines DATA are electrically connected to the data line driving circuits HDRV, and are disposed so as to pass through the respective pixels (DPXL, PXL) lined up above and below. The current supply lines CSL are disposed so as to pass through the respective pixels (DPXL, PXL) lined up above and below between the data lines DATA. The current supply bus line CSBL is a distribution line which connects the respective current supply lines CSL and runs as far as the outside terminals PAD. The line is connected to the outside terminals via the left and right data line driving circuits HDRV. The luminescence control line ILM is electrically connected to the first scanning line driving circuit VDRV1, and the connection is configured so as to pass through the respective pixels (DPXL, PXL) lined up to the left and right. The reset line is electrically connected to the second scanning line driving circuit VDRV2, and the connection is configured so as to pass through the respective pixels (DPXL, PXL) lined up to the left and right. Furthermore, the data lines DATA, current supply line CSL, luminescence control line ILM, and reset line RES which pass through the display pixels PXL are arranged so as to be able to supply signals, but the wiring is interrupted so that signals are not supplied to the wiring passing through the dummy pixels DPXL, and the system is arranged so that the dummy pixels DPXL do not emit light. The outside terminals PAD are lined up on the upper side of the first substrate SUB1. The sealing region SEAL is disposed so as to enclose the common electrode.

Figure 7:
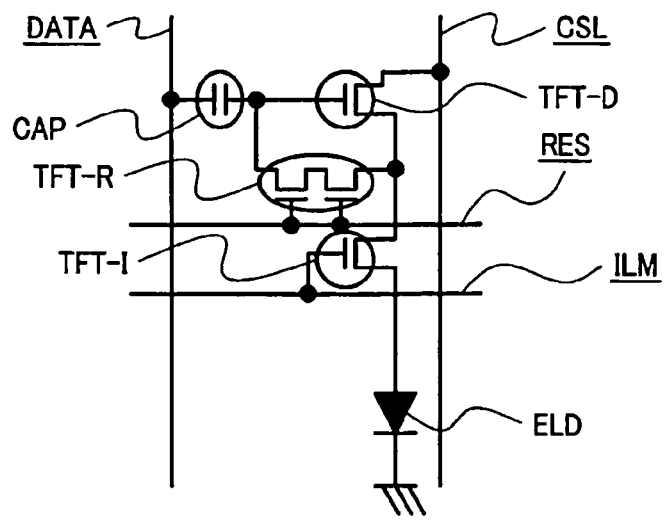
FIG. 7 is view of a pixel equivalent circuit disposed in dummy pixels DPXL and display pixels PXL.

FIG. 7 is a view of a pixel equivalent circuit disposed in dummy pixels DPXL and display pixels PXL.

As was described above, the respective pixels comprise data lines DATA and current supply lines CSL extending in the vertical direction, and luminescence control lines ILM and reset lines RES extending in the left-right direction. Furthermore, each of the pixels comprises a capacitance CAP, a reset switch TFT-R, a luminescence control switch TFT-I, a driving switch TFT-D, and an organic EL element ELD. Either the source or the drain of the driving switch TFT-D is electrically connected to the current supply line CSL, and the other of these two parts is electrically connected to a pixel electrode acting as the anode of the organic EL element ELD. The gate of the luminescence control switch TFT-I is electrically connected to the luminescence control line ILM, and the source and drain are electrically connected between the driving switch TFT-D and organic EL element ELD. The capacitance CAP is electrically connected between the data lines DATA and the gate of the driving switch TFT-D. In the reset switch TFT-R, either the source or the drain is electrically connected between the capacitance CAP and the driving switch TFT-D, and the other of these two parts is electrically connected between the driving switch TFT-D and the luminescence control switch TFT-I. The gate of the TFT-R is electrically connected to the reset line RES.

Luminescence control is performed as follows in this pixel circuit. First, one frame is divided into a first half and second half; in the first half, both the reset switch TFT-R and the luminescence control switch TFT-I are simultaneously switched to an "on" state, and current is caused to flow from the current supply lines CSL via the diode-connected driving switch TFT-D and luminescence control switch TFT-I. In this case, the gate voltage of the driving switch TFT-D is pulled down to a gate voltage that is matched to the driving current of the organic EL element OLED. Next, when the electroluminescence control switch TFT-I is switched off by the electroluminescence control line ILM, the drain terminal of the driving switch TFT-D is saturated toward a voltage value that obtained by subtracting the threshold voltage Vth from the power supply voltage, and the driving switch TFT-D is switched off at this time. The reset switch TFT-R is reset by the reset line RES so that the difference between the gradation voltage supplied from the data lines DATA and the threshold voltage Vth is stored in the capacitance CAP, and the writing of the gradation voltage into the pixel is completed.

The writing of the gradation voltage subsequently shifts to the pixels of the next row, and these pixels shift to the second half of the luminescent period. In a state in which the luminescence control switch TFT-I is switched on and the reset switch TFT-R is switched off, a triangular wave is supplied to the data lines DATA. The sum of the voltage of the triangular wave and the voltage stored in the capacitance CAP is applied to the gate of the driving switch TFT-D, and at the point in time at which the gate voltage of the driving switch TFT-D exceeds the threshold voltage, the driving switch TFT-D is turned on, and light emission is initiated. At the point in time at which the gate voltage falls below the threshold voltage, the driving switch TFT-D is turned off, and light emission is interrupted. In other words, since the triangular wave is applied to the gate of the driving switch TFT-D via the capacitance CAP, the gate voltage of the driving switch TFT-D varies with time in accordance with the temporal variations in the magnitude of the voltage held in the capacitance CAP in accordance with the gradation voltage and the magnitude of the triangular wave voltage, and the period in which the threshold voltage Vth of the driving switch TFT-D is exceeded is controlled.

[Conventional Aspect of Pixels]

Next, a conventional layered structure of the pixels will be described.

Figure 8:
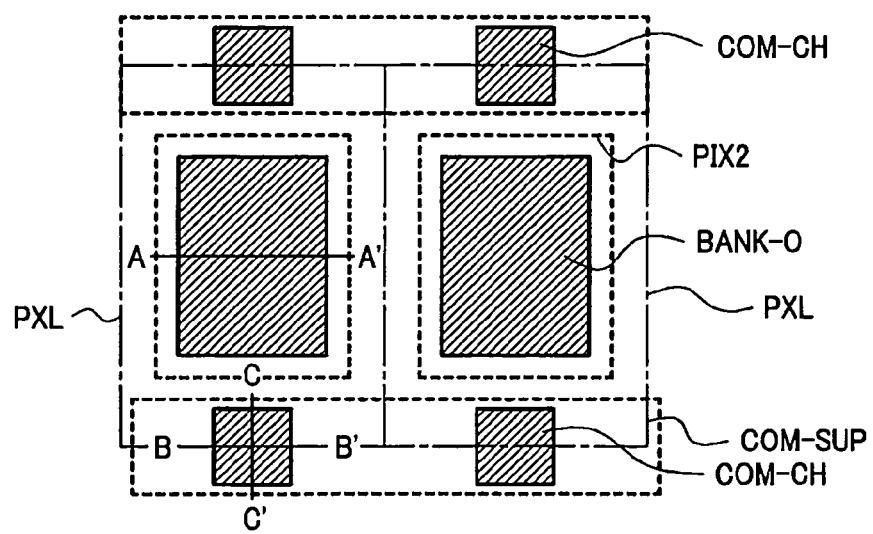
FIG. 8 is a top view of two adjacent left and right pixels.
Figure 9:
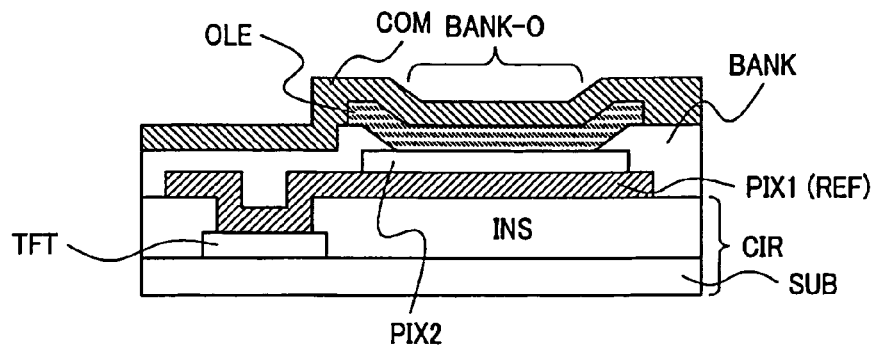
FIG. 9 is a sectional view along line A-A' of FIG. 8 in a conventional aspect.

FIG. 8 is a top view of two adjacent left and right pixels
FIG. 9 is a sectional view along line A-A' of FIG. 8.

The pixels PXL have a plurality of switching TFTs which are thin-film transistors on the surface of a glass substrate SUB. An insulating film INS is disposed on top of the switching TFTs. The layers up to this point are referred to as circuit layers CIR. An opening is formed in the insulating film INS. A combination pixel electrode and reflective film PIX1 (REF) composed of AlSi/MoW, which is a reflective metal connected to the switching TFT via the opening, is provided on the surface of the insulating film INS. A second pixel electrode PIX2 composed of a transparent electroconductive film (e.g., ITO) is provided on top of the first pixel electrode PIX1. A bank BANK is formed for insulating and separating the adjacent first pixel electrode PIX1 and second pixel electrode PIX2. The bank covers the outside edge of the first pixel electrode PIX1 and the outside edge of the second pixel electrode PIX2, and has a bank opening BANK-O which exposes the center of the second pixel electrode PIX-2. An organic functional layer OLE which includes a light-emitting layer is disposed on top of the bank BANK. A transparent electroconductive film (e.g., IZO) is disposed as a common electrode COM on top of the organic functional layer OLE. A hole injection layer, hole transport layer, light-emitting layer, electron transport layer, and electron injection layer are layered in the organic functional layer OLE in that order from the surface of the second pixel electrode PIX2.

As is shown in FIG. 8, auxiliary wiring COM-SUP is formed between the top and bottom of the pixels PXL. In concrete terms, a reflective metal is disposed in an insulated and separated state between the first pixel electrodes REF. The auxiliary wiring COM-SUP is an electrode that is common to the left and right pixels, and is an electrode that is long in the left-right direction. A common electrode contact hole COM-CH, which is a contact hole that ensures contact between the auxiliary wiring COM-SUP and common electrode COM, is disposed precisely between the first pixel electrodes REF (reflective layer).

[Aspect 1 of the Pixels]

Aspect 1 of a pixel structure using the present invention is shown in FIGS. 10 through 16.

The sectional structure of the pixel electrode and reflective electrode formed on top of the circuit layer CIR is different from the abovementioned conventional aspect.

Figure 10:
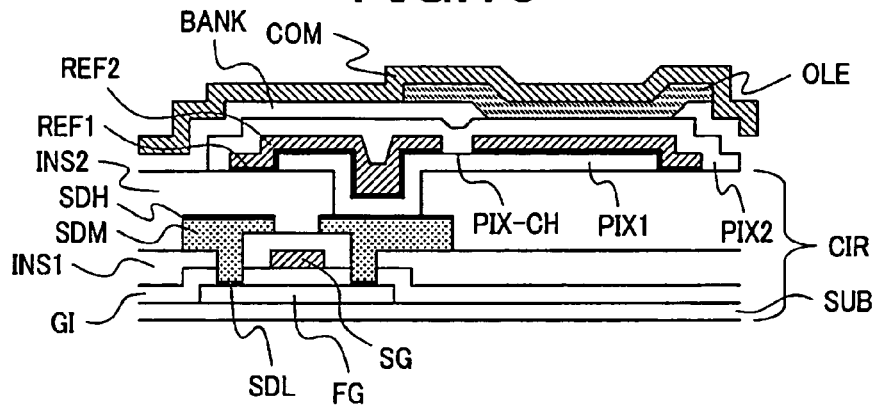
FIG. 10 is a sectional view corresponding to the sectional view along line A-A' of FIG. 8 in aspect 1 of the pixel structure.

FIG. 10 is a view showing the sectional structure of one of the pixels in the sectional view along line A-A' in FIG. 8. FIGS. 11 through 16 are diagrams showing the manufacturing processes in the present invention.

The glass substrate SUB is a non-alkaline glass having a thickness of 0.7 mm. A layered film of a silicon nitride layer SiN having a thickness of 150 nm and a silicon dioxide layer $SiO_2$ having a thickness of 100 nm was formed by P-CVD on the surface of the glass substrate SUB.

A polysilicon layer FG was formed by P-CVD on the surface of the layered film, and was patterned using photolithography. The polysilicon layer FG was formed in island form at locations where thin-film transistors (hereafter referred to as "TFTs") were formed and at locations where capacitances CAP were formed. It would also be possible to use amorphous silicon instead of polysilicon; in the present aspect, however, the silicon re-crystallized from amorphous silicon was used in order to improve the TFT characteristics.

A gate insulating layer GI was formed on top of the polysilicon layer FG. In the present example, the gate insulating layer GI, referred to as a TEOS film, was composed of silicon dioxide $SiO_2$ having a thickness of 110 nm formed by P-CVD.

A metal gate electrode layer SG was formed in a position overlapping the channel region of the polysilicon layer FG on top of the gate insulating layer GI. A metal gate electrode layer SG was formed by forming a MoW film having a thickness of 150 nm by sputtering and patterning the layer by photolithography.

A first inter-layer insulating film INS1 was formed over the entire surface on top of the metal gate electrode layer SG and on top of the gate insulating layer GI. The first inter-layer insulating film INS1 was formed by P-CVD from silicon dioxide $SiO_2$ in a thickness of 500 nm. Furthermore, openings were formed in prescribed locations (on the source and drain regions) in the first inter-layer insulating film INS1.

Figure 11:
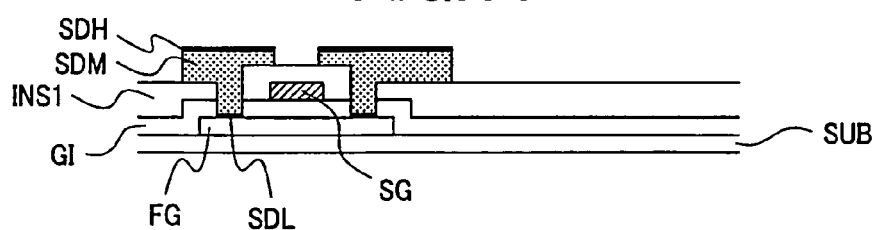
FIG. 11 is a view showing the manufacturing process.

The source-drain metal layers SD were formed into a three-layer layered structure composed of the source-drain metal layer SDL of the lowermost layer, the source-drain metal layer SDM of the intermediate layer, and the source-drain metal layer SDH of the uppermost layer. Furthermore, first contact holes were formed with a pattern such that contact was made with the polysilicon layer FG via the abovementioned openings in the first inter-layer insulating film INS1. In the layered structure, the films were formed by sputtering so that a layered structure of MoW (75 nm)/AlSi (500 nm)/MoW (38 nm) was obtained from the side of the substrate, and the structure was worked into a wiring pattern using photolithography. FIG. 11 is a view showing the sectional structure of the substrate manufactured up to this point.

Figure 12:
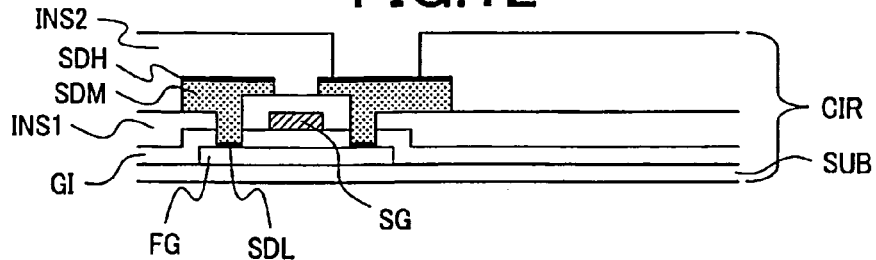
FIG. 12 is a view showing the manufacturing process.

A second inter-layer insulating film INS2 was formed over the entire surface on top of the first inter-layer insulating film INS1 and on top of the source-drain metal layer SDH. In the second inter-layer insulating film INS2, a silicon nitride (SiN) film having a thickness of 500 nm was formed by plasma CVD. On top of this film, an organic insulating film was formed from an acrylic, polyimide, or epoxy to a thickness of 1 μm by coating and firing. In the second inter-layer insulating film INS2, an opening was formed in positions shifted from the first contact holes. The opening was used as a second contact hole for the pixel electrode. An effect was thereby obtained that makes it less likely that defective contact will form, and reduces the contact area of the contact hole. The layers up to this point were circuit layers CIR. FIG. 12 is a view showing the sectional structural of the substrate manufactured up to this pint.

A pixel electrode was formed on top of the second inter-layer insulating film INS2, which was the uppermost layer of the circuit layers CIR. Four layers, i.e., a first pixel electrode PIX1, a first reflective electrode layer REF1, a second reflective electrode layer REF2, and a second pixel electrode PIX2, were layered as pixel electrodes in that order by sputtering from the substrate SUB, and were patterned by photolithography.

Figure 13:
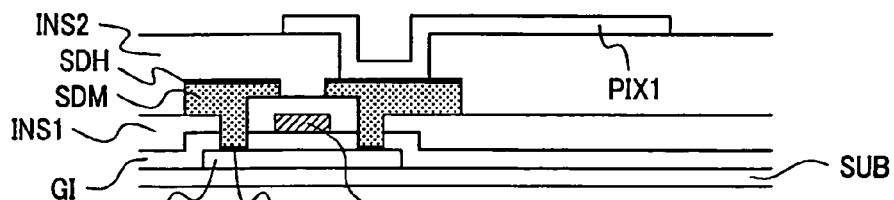
FIG. 13 is a view showing the manufacturing process.

First, FIG. 13 is a view showing the manner in which the first pixel electrode PIX1 was formed. Specifically, ITO films were formed, a prescribed pixel pattern was formed and worked by photolithography, and the films were crystallized by heat. The first pixel electrode PIX1 may also be composed of chromium Cr.

Figure 14:
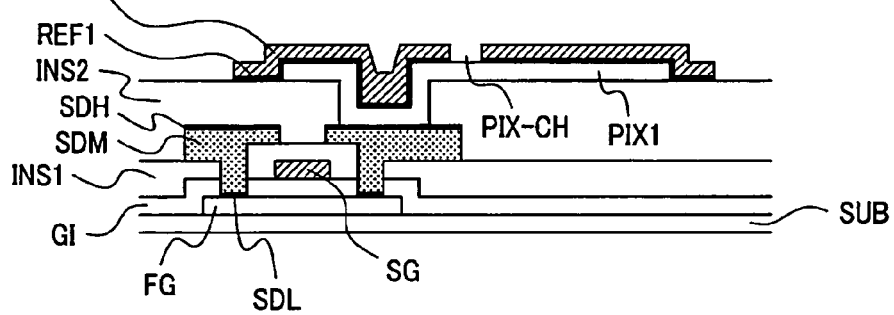
FIG. 14 is a view showing the manufacturing process.

Next, FIG. 14 is a view showing the manner in which the first reflective electrode REF1 and second reflective electrode REF2 were formed. Specifically, MoW and AlSi were successively formed into a film by sputtering in a continuous process, and the film was worked into a prescribed pixel pattern by photolithography. The worked pattern was larger than the first pixel electrode PIX1, and covered the entire first pixel electrode PIX1.

Figure 15:
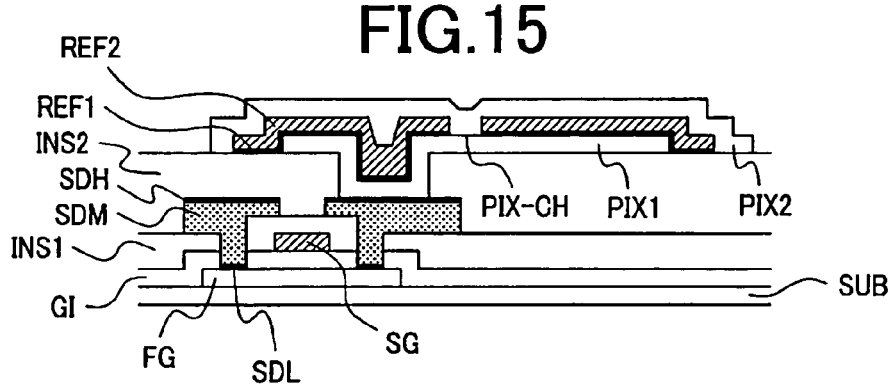
FIG. 15 is a view showing the manufacturing process.

Next, FIG. 15 is a view showing the manner in which the second pixel electrode PIX2 was formed. Specifically, ITO films were formed, a prescribed pixel pattern was formed and worked by photolithography, and the films were crystallized by heat.

The first pixel electrode PIX1 and second pixel electrode PIX2 were caused to make contact via a contact hole PIX-CH formed in the inner part of the first reflective electrode REF1 and second reflective electrode REF2.

The first reflective electrode REF1 and second reflective electrode REF2 were patterned in the same manner, and a pattern was used that covered the entire first pixel electrode PIX1 except for the contact hole PIX-CH.

The second pixel electrode PIX2 was formed in a pattern that covered the entire first reflective electrode REF1 and second reflective electrode REF2.

A structure was used in which the widths of the respective layers of the layer structure that formed the pixel electrodes satisfied the relationship of Eq. 1 below, the uppermost layer covered the entire exposed surface (upper surface) of the intermediate layer, and the intermediate layer covered the entire exposed surface (upper surface) of the lowermost layer.

$$PIX1(ITO1) < REF2(AlSi) \approx REF1(MoW)(\text{bulk etching}) < PIX2(ITO2) \qquad \text{Eq. 1}$$

However, a contact hole or notch (exception to Eq. 1) is formed in a portion of the intermediate layer, and ITO1 and ITO2 are directly connected.

In this layered structure, the uppermost layer covers the entire intermediate layer, and the intermediate layer covers the entire lowermost layer. Accordingly, there is less possibility that the Al of the intermediate layer and the ITO1 or ITO2 will simultaneously make direct contact with the resist stripping liquid.

Figure 16:
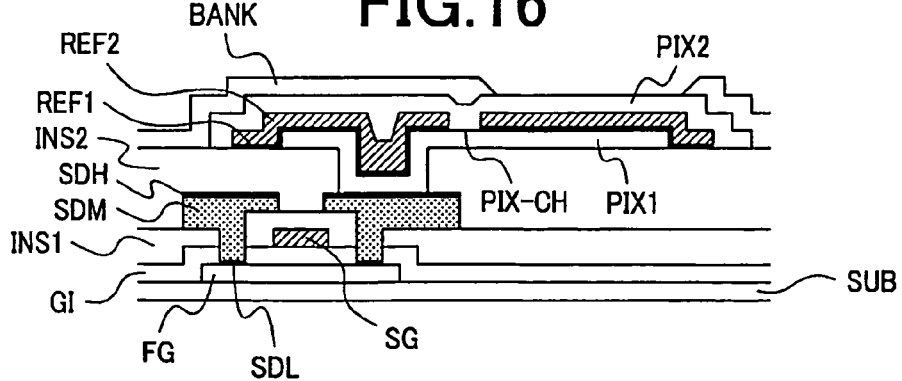
FIG. 16 is a view showing the manufacturing process.

Next, FIG. 16 is a view showing the manner in which the entire outer edges of all four layers, i.e., the first pixel electrode PIX1, first reflective electrode REF1, second reflective electrode REF2, and second pixel electrode PIX2, are covered by the bank BANK. The bank BANK was composed of SiN formed by P-CVD and configured so as to maintain insulating properties between adjacent second pixel electrodes PIX2. Furthermore, an opening for exposing the second pixel electrode PIX2 was formed from the bank BANK. The bank BANK may also be composed of an organic insulating film such as a polyimide.

In order to remove organic matter from the surfaces of the second pixel electrode PIX2 and bank BANK, an oxygen plasma treatment was performed on the surfaces of the second pixel electrode PIX2 and bank BANK following the formation of the bank BANK but prior to the formation of the organic functional layer OLE. The oxygen concentration at the exposed surface of the second pixel electrode PIX2 was thereby brought above the oxygen concentration at the surface of the second pixel electrode hidden beneath the bank BANK. In this case, UV irradiation was performed in order to adjust the work function of the second pixel electrode PIX2. As a result of this oxygen plasma treatment and UV irradiation, the work function varied from 4.8 eV to 5.3 eV.

The hole injection layer, hole transport layer, and light-emitting layer in the organic functional layer OLE were formed by providing a striped pattern to the upper surface of the bank BANK and the opening region enclosed by the bank BANK of the second pixel electrode PIX2. The electron transport layer was vapor deposited using the overall pattern common to all of the pixels (so-called beta pattern), and a codeposited film of $CaCo_3$ constituting the electron injection layer and the electron injection material of the electron transport layer was vapor deposited in a beta pattern. Furthermore, it would also be possible to use a delta pattern instead of a striped pattern.

A common electrode COM of IZO (indium zinc oxide) was formed by sputtering on top of the organic functional layers OLE, and a common pattern for all of the pixels was obtained by photolithography.

[Aspect 1 of Auxiliary Wiring]

Aspect 1 of an application of the present invention to auxiliary wiring is shown.

Figure 17:
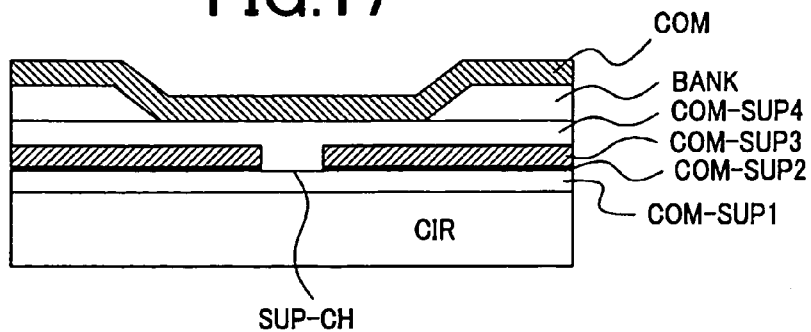
FIG. 17 is a sectional view corresponding to the sectional view along line B-B' of FIG. 8 in aspect 1 of the auxiliary wiring.
Figure 18:
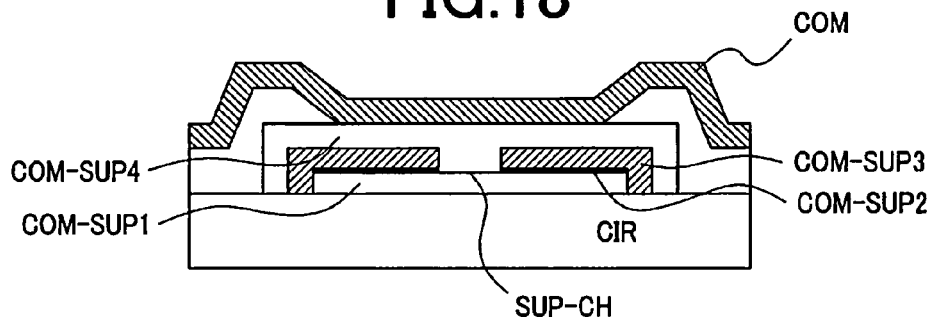
FIG. 18 is a sectional view corresponding to the sectional view along line C-C' of FIG. 8 in aspect 1 of the auxiliary wiring.

FIG. 17 is a sectional view corresponding to the sectional view along line B-B' of FIG. 8 in the present aspect, and FIG. 18 is a sectional view corresponding to the sectional view along line C-C' of FIG. 8 in the present aspect.

Four layers, i.e., the first auxiliary wiring COM-SUP1 through fourth auxiliary wiring COM-SUP4, were sequentially layered from the substrate-SUB on top of the circuit layers CIR in a simultaneous process using the same materials and same layer structure as in the four layers mentioned above, i.e., first pixel electrode PIX1, first reflective electrode REF1, second reflective electrode REF2, and second pixel electrode PIX2.

The first auxiliary wiring COM-SUP1 was composed of ITO or Cr, and was formed with the most slender shape, as shown in FIGS. 17 and 18.

The second auxiliary wiring COM-SUP2 was composed of MoW, and the third auxiliary wiring COM-SUP3 was composed of AlSi. The second auxiliary wiring and third auxiliary wiring COM-SUP3 were formed in the same pattern. Since alumina constituting a oxidation film was formed on the surface of the third auxiliary wiring COM-SUP3, portions of the second auxiliary COM-SUP2 and third auxiliary wiring COM-SUP3 were removed during photolithographic working of the reflective electrodes, and openings were formed. As a result of this contact hole, electrical continuity was ensured between the first auxiliary wiring COM-SUP1 and the subsequently formed fourth auxiliary wiring COM-SUP4.

The fourth auxiliary wiring COM-SUP4 was formed so as to cover the upper surface and side surfaces of the third auxiliary wiring COM-SUP3.

The outside edges of the four auxiliary wirings were covered by the bank BANK, and only a portion of the center was open. The IZO of the common electrode COM was formed into a film by sputtering from above this opening, and was worked by photolithography, producing a structure in which the electrical continuity of the fourth auxiliary wiring COM-SUP4 and the common electrode COM was ensured.

Specifically, in FIG. 8, the first auxiliary wiring COM-SUP1, second auxiliary wiring COM-SUP2, third auxiliary wiring COM-SUP3, and fourth auxiliary wiring COM-SUP4 were engraved in the same pattern. However, in the auxiliary wiring of this aspect as well, the widths of the respective layers of the layered structure satisfy the relationship of Eq. 3; furthermore, the uppermost layer covers the exposed surfaces of the intermediate layer, and the intermediate layer covers the exposed surfaces of the lowermost layer.

First auxiliary wiring COM-SUP1(ITO1)<Second auxiliary wiring COM-SUP2(MoW)≈Third auxiliary wiring COM-SUP3(AlSi)<Fourth auxiliary wiring COM-SUP4(ITO2)    Eq. 3

Here, a contact hole or notch (exception to Eq. 3) was formed in a portion of the intermediate layer, and the first auxiliary wiring COM-SUP1 and forth auxiliary wiring COM-SUP4 were directly connected.

[Aspect 2 of Auxiliary Wiring]

Next, Aspect 2 of the application of the present invention to auxiliary wiring will be described.

Figure 19:
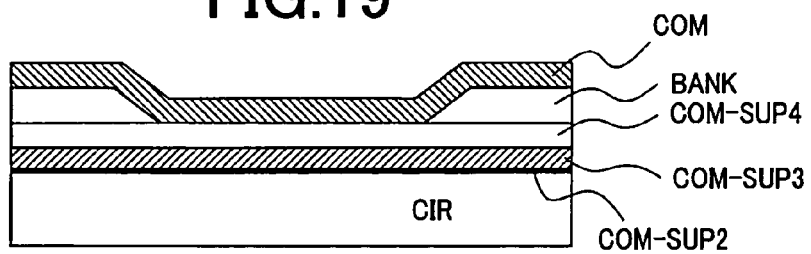
FIG. 19 is a sectional view corresponding to the sectional view along line B-B' of FIG. 8 in aspect 2 of the auxiliary wiring.
Figure 20:
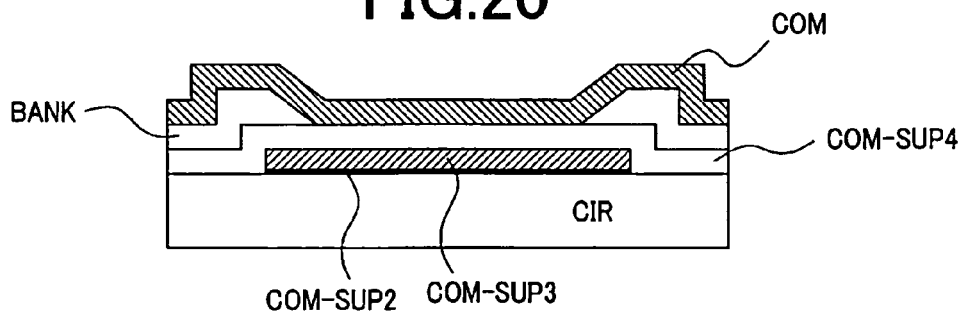
FIG. 20 is a sectional view corresponding to the sectional view along line C-C' of FIG. 8 in aspect 2 of the auxiliary wiring.

FIG. 19 is a sectional view corresponding to the sectional view along line B-B' of FIG. 8 in the present aspect, and FIG. 20 is a sectional view corresponding to the sectional view along line C-C' of FIG. 8 in the present aspect.

Second auxiliary wiring COM-SUP2 and third auxiliary wiring COM-SUP3 composed of the same reflective metal as the first reflective electrode REF1 and second reflective electrode REF2 were simultaneously formed by the same process as the reflective electrodes on top of the circuit layer CIR. Fourth auxiliary wiring COM-SUP4 composed of the same ITO layer as the second pixel electrode PIX2 was simultaneously formed on top of the third auxiliary wiring COM-SUP3 by the same process as the second pixel electrode PIX2. A bank BANK having an opening BANK-O was disposed on top of the fourth auxiliary wiring COM-SUP4.

Specifically, in FIG. 8, the second and third auxiliary wiring COM-SUP2 and COM-SUP3 and the fourth auxiliary wiring COM-SUP4 were engraved the same pattern; in this aspect, however, as is shown in FIG. 20, the system was devised so that the underlying second and third auxiliary wiring COM-SUP2 and COM-SUP3 were formed with a narrower width than the upper-layer fourth auxiliary wiring COM-SUP4, and the entire underlying second and third auxiliary wiring COM-SUP2 and third auxiliary wiring COM-SUP3 were covered by the upper-layer fourth auxiliary wiring COM-SUP4.

[Aspect 3 of Auxiliary Wiring]

Next, Aspect 3 of the application of the present invention to auxiliary wiring will be described.

Figure 21:
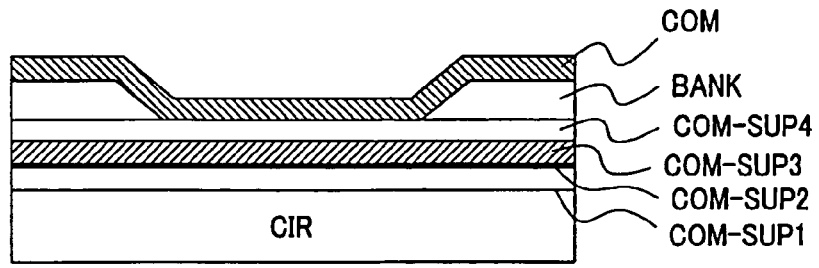
FIG. 21 is a sectional view corresponding to the sectional view along line B-B' of FIG. 8 in aspect 3 of the present wiring.
Figure 22:
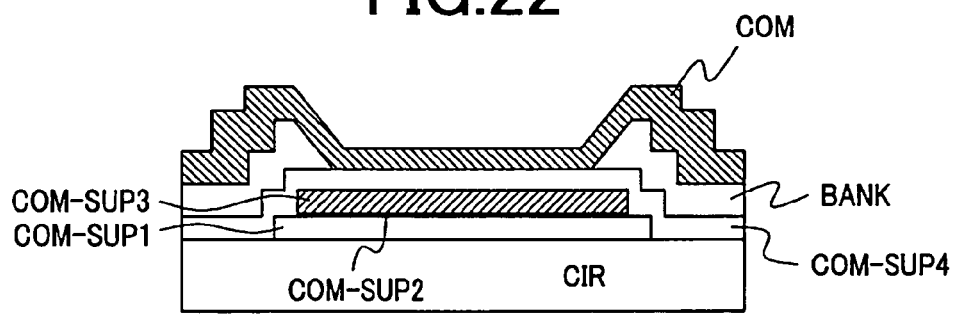
FIG. 22 is a sectional view corresponding to the sectional view along line C-C' of FIG. 8 in aspect 3 of the present wiring.

FIG. 21 is a sectional view corresponding to the sectional view along line B-B' of FIG. 8 in the present aspect, and FIG. 22 is a sectional view corresponding to the sectional view along line C-C' of FIG. 8 in the present aspect.

In the structure shown in FIG. 22, second auxiliary wiring COM-SUP2 and third auxiliary wiring COM-SUP3 composed of the same reflective metal as the first reflective electrode REF1 and second reflective electrode REF2 were simultaneously formed on top of the circuit layer CIR by the same process as the reflective electrodes. Fourth auxiliary wiring COM-SUP4 composed of the same ITO as the second pixel electrode PIX2 was simultaneously formed by the same process as the second pixel electrode ITO2 on top of third auxiliary wiring COM-SUP3. A bank BANK having an opening BANK-O was disposed on top of the fourth auxiliary wiring COM-SUP4. A common electrode COM composed of IZO was disposed on top of the bank, and the electrode was connected to the fourth auxiliary wiring COM-SUP4 via the opening BANK-O.

A characteristic of the structure in FIG. 22 is that the first auxiliary electrode COM-SUP1 and fourth auxiliary electrode COM-SUP4 are wider than the second auxiliary electrode COM-SUP2 and third auxiliary electrode COM-SUP3, and that the entire first auxiliary electrode COM-SUP1 is covered by the fourth auxiliary electrode COM-SUP4. Furthermore, instead of a contact hole SUP-CH being formed, the first auxiliary electrode COM-SUP1 and fourth auxiliary electrode COM-SUP4 are connected from the side of the second auxiliary electrode COM-SUP2 and third auxiliary electrode COM-SUP3.

In FIG. 8, the first auxiliary electrode COM-SUP1 through fourth auxiliary wiring COM-SUP4 were engraved in the same pattern; in this aspect, however, a structure is used in which the widths of the respective layers satisfy the relationship of Eq. 4 below, the outside edges of the intermediate layer (third auxiliary electrode COM-SUP3/second auxiliary electrode COM/SUP-2) are located in the same position as, or to the inside of, the outside edges of lowermost layer (first auxiliary electrode COM-SUP1), the exposed surfaces of the lowermost layer are covered by the uppermost layer (fourth auxiliary electrode COM-SUP4), and electrical connections are ensured by connecting the uppermost layer carried on the intermediate layer and the lowermost layer exposed from the ends of the intermediate layer.

$$\text{Second auxiliary electrode COM-SUP2} \approx \text{Third auxiliary electrode COM-SUP3} \leq \text{First auxiliary electrode COM-SUP1} < \text{fourth auxiliary electrode COM-SUP4} \quad \text{Eq. 4}$$

Thus, since the ITO of the lowermost layer is exposed from the aluminum of the intermediate layer, the ITO of the lowermost layer and the aluminum of the intermediate layer make contact with the resist stripping liquid, but the ITO of the uppermost layer and the aluminum of the intermediate layer do not make contact in the resist stripping liquid; accordingly, the battery reaction arising in the ITO of the uppermost layer can be suppressed.

Furthermore, it would also be possible to use Cr instead of the ITO of the lowermost layers.

[Aspect 2 of Pixel Structure]

Shown next is a sectional structural diagram of Aspect 2 of pixel structure to which the present invention is applied.

Figure 23:
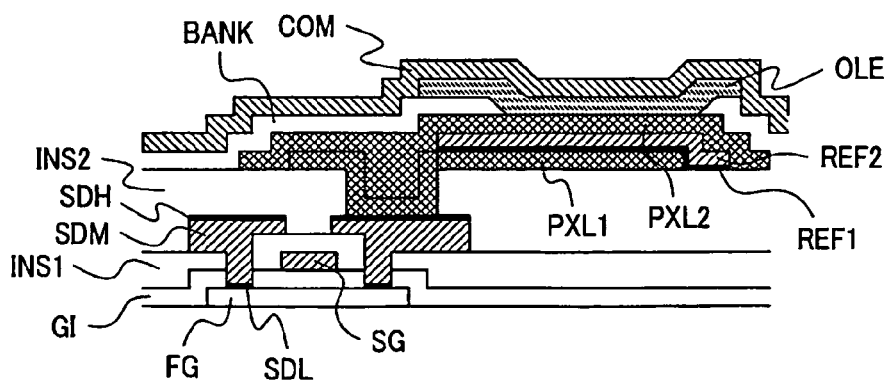
FIG. 23 is a sectional view corresponding to the sectional view along line A-A' of FIG. 8 in aspect 2 of the pixel structure.

FIG. 23 is a view showing a sectional structure that corresponds to the sectional view along line A-A' of FIG. 8 in the present aspect.

The point of difference between FIG. 10 and FIG. 23 is that the first pixel electrode PIX1 is formed in a larger size than the first reflective electrode REF1 and second reflective electrode REF2. Contact can thereby be made between the first pixel electrode PIX1 and second pixel electrode PIX2 in the region where the first reflective electrode REF1 and second reflective electrode REF2 are not formed, without forming a contact hole PIX-CH in the first reflective electrode REF1 and second reflective electrode REF2. A reliable current supply to the second pixel electrode PIX2 can be achieved by maintaining this contact.

Contact between the first pixel electrode PIX 1 and second pixel electrode PIX2 is possible in the outside region where no first reflective electrode REF1 or second reflective electrode REF2 is formed, even without forming a contact hole OPIX-CH in the first reflective electrode REF1 and second reflective electrode REF2. A reliable current supply to the second pixel electrode PIX2 can be realized by maintaining this contact.

Specifically, in Aspect 2 of the pixel structure, the widths of the respective layers of the layered structure satisfy the relationship of Eq. 2 below, the outside edges of the intermediate layer (REF2 (AlSi)/REF1 (MoW)) are located in the same position as, or to the inside of, the outside edges of the first pixel electrode PIX1 (ITO1) of the lowermost layer, the exposed surfaces of the first pixel electrode PIX1 are covered by the second pixel electrode PIX2 (ITO2), and the connection between the second pixel electrode PIX2 carried on the intermediate layer and the first pixel electrode PIX1 exposed from the ends of the intermediate layer is ensured.

$$\text{REF1(Mo)} \approx \text{REF2(AlSi)} \leq \text{PIX1(ITO1)} < \text{PIX2(ITO2)} \quad \text{Eq. 2}$$

Thus, since the ITO1 of the lowermost layer is exposed from the intermediate layer, the ITO1 of the lowermost layer and the Al of the intermediate layer make contact with the resist stripping liquid. However, the ITO2 of the uppermost layer and the intermediate layer do not make contact with the resist stripping liquid; accordingly, a battery reaction caused by the ITO2 of the uppermost layer can be suppressed.

Furthermore, Cr may be used instead of the ITO1 of these underlayers.

Furthermore, aspects 1 through 3 of the auxiliary wiring and aspects 1 or 2 of the pixel structure may be arbitrarily combined.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a plurality of active elements on a substrate;
   a first insulating film for covering the plurality of active elements;
   electroconductive films disposed in a state separated for each pixel on the first insulating film;
   a hole formed on the first insulating film for conducting each of the plurality of active elements to each of the electroconductive films;
   light-emitting layers disposed in an upper layer of the electroconductive films; and
   a common electrode disposed in an upper layer of the light-emitting layers; wherein each of the electroconductive films has a layered film of a first electroconductive film,
a second electroconductive film and a third electroconductive film,
the first electroconductive film is composed of a material that includes ITO or chromium,
the first electroconductive film is disposed closer to the substrate than the second electroconductive film,
the third electroconductive film is a layer which is closer to the common electrode than the first electroconductive film and the second electroconductive film,
the second electroconductive film is composed of a material that includes aluminum,
the third electroconductive film is composed of a material that includes ITO,
the third electroconductive film covers an outside edge and a side surface of the second electroconductive film, whereby the third electroconductive film protrudes from the side surface of the second electroconductive film in plan view,
the first electroconductive film and the third electroconductive film are in contact with each other in an area that includes a portion on which the hole is formed,
the portion on which the hole is formed is covered by a bank layer formed between the third electroconductive film and the common electrode,
a contact hole is formed on the second electroconductive film only through the second electroconductive film, and
the first electroconductive film and the third electroconductive film are directly in contact with each other via at least one of the contact hole and the notch.

2. The display device of claim 1, wherein
the first electroconductive film has an upper surface portion exposed from the second electroconductive film; and
the first electroconductive film and the third electroconductive film are directly in contact with each other in the upper surface portion exposed from the second electroconductive film.

3. The display device of claim 2, wherein
the first electroconductive film is exposed from the second electroconductive film on the outside of the outside edge of the second electroconductive film; and
the first electroconductive film and the third electroconductive film are directly in contact with each other on the outside of the outside edge of the second electroconductive film.

4. The display device of claim 1, wherein a first contact hole is formed on the second electroconductive film only through the second electroconductive film, a second insulating film for covering the outside edge of the first electroconductive film is provided between the third electroconductive film and the common electrode; and the first contact hole is covered by the second insulating film.

5. The display device of claim 1, wherein a second insulating film for covering the outside edge of the first electroconductive film is provided between the third electroconductive film and the common electrode; a second contact hole is provided in the first insulating film; the third electroconductive film is supplied with a current from one of the active elements via the second contact hole; and the second contact hole is covered by the second insulating film.

* * * * *